United States Patent [19]

Bartelink et al.

[11] 3,714,473

[45] Jan. 30, 1973

[54] PLANAR SEMICONDUCTOR DEVICE UTILIZING CONFINED CHARGE CARRIER BEAMS

[75] Inventors: Dirk Jan Bartelink, Morris Township; George Persky, North Plainfield, both of N.J.

[73] Assignee: Bell Telephone Laboratories, Incorporated, Murray Hill, N.J.

[22] Filed: May 12, 1971

[21] Appl. No.: 142,629

[52] U.S. Cl. ..................307/299, 307/304, 307/309, 307/311, 317/235 Y, 317/235 AD, 317/235 H

[51] Int. Cl. ..............................................H01l 5/00

[58] Field of Search .......317/235 Y, 235 AD, 235 H; 307/299, 304, 311

[56] References Cited

UNITED STATES PATENTS

| | | | |
|---|---|---|---|
| 3,668,439 | 6/1972 | Fujikawa et al. | 317/235 H |
| 2,790,037 | 4/1957 | Shockley | 317/235 AD |
| 3,226,596 | 12/1965 | Kasperowicz | 313/92 F |
| 3,524,998 | 8/1970 | Gilbert | 317/235 Y |
| 3,427,559 | 2/1969 | Criichi et al. | 317/235 Y |
| 3,519,899 | 7/1970 | Yamada | 317/235 H |
| 2,553,490 | 5/1951 | Wallace | 317/235 H |

*Primary Examiner*—John W. Huckert
*Assistant Examiner*—William D. Larkins
*Attorney*—R. J. Guenther and Arthur J. Torsiglieri

[57] ABSTRACT

A planar geometry P-I-N semiconductor structure, under a reverse voltage bias, is arranged for use as a solid state analogue of a cathode-ray tube. A charge carrier beam (of "holes") is propagated through the (intrinsic or semi-intrinsic) I region to the P zone, in response to forward voltage bias applied to an auxiliary $P^+$ zone located within the N zone, or in response to a beam of optical radiation incident on the N zone. While traversing the I region, this charge carrier beam maintains a relatively confined cross section while it is controllably deflected in two independent directions by auxiliary applied electric fields. Thereby, the position of impact of the charge carrier beam at the P zone is controllable in two dimensions, and the instantaneous impact position can be detected thereat by a two-dimensional array of detector load resistors connected to the P zone.

17 Claims, 4 Drawing Figures

INVENTORS D. J. BARTELINK
G. PERSKY
BY D Caplan
ATTORNEY

PLANAR SEMICONDUCTOR DEVICE UTILIZING CONFINED CHARGE CARRIER BEAMS

FIELD OF THE INVENTION

This invention relates to the field of solid state semiconductor apparatus, in particular to charge carrier beam deflection apparatus in which a beam of charge carriers in a semiconductor body is deflected by electric or magnetic fields applied to the body.

BACKGROUND OF THE INVENTION

In the U.S. Pat. application Ser. No. 888,331 filed on Dec. 29, 1969, (now U.S. Pat. No. 3,593,045 ), the present inventors have described reverse biased P-I-N type semiconductor structures which support charge carrier beams (of electrons or holes). These beams can be controllably deflected in two directions by applied electric or magnetic fields. Such structures, being the solid state analogues of cathode-ray tubes, were shown to be adaptable for use as multiaddress electronic switches, as well as camera devices. However, the apparatus described in the aforementioned patent application were limited to the case in which the charge carrier beam traversed the I region from one major surface thereof to an opposed major surface thereof, that is, the apparatus had a nonplanar geometry. Since the fabrication of a planar semiconductor device geometry is simpler and cheaper than a nonplanar geometry, it is desirable to provide a semiconductor device supporting a charge carrier beam characterized by a planar arrangement on a single major surface of the semiconductor, while still preserving the ability to deflect the charge carrier beam in two independent directions.

SUMMARY OF THE INVENTION

In accordance with this invention, a charge carrier beam of electrons (or holes) is propagated with a relatively confined cross section through a relatively high resistivity region (to be denoted by I-type conductivity) in a monocrystalline body of a semiconductor such as silicon. The beam propagates from a localized area on a major planar surface of the body to another separate localized area on the same major planar surface. These localized areas are mutually spaced apart by the high resistivity region in the body.

The charge carrier beam can be injected in the intrinsic region by the emission of charge carriers from an auxiliary forward biased P-N junction of confined cross section located in one of the localized areas, or by the emission of charge carriers in the intrinsic zone in response to a beam of light ("photoexcitation") of confined cross section. A suitably large bias voltage is applied across the pair of localized areas, such that the charge carrier beam propagates through the I region from one localized area to the other localized area, while maintaining a confined cross section, i.e., without substantial beam spreading or lateral diffusion. This bias voltage is selected in the optimal case such that the lateral diffusion of charge carriers during the time of transit, from one localized area to the other, is at a minimum.

Controllable deflection of the charge carrier beam in the I region is obtained by means of auxiliary electric or magnetic fields produced in the I region of the semiconductor body at right angles (transverse) to the direction of propagation of the beam of charge carriers. Thereby, a resultant force is produced on the charges in the beam in the I region, which thereby controls the trajectory of this beam.

In order to obtain the sufficiently high electric field in the I region, as mentioned above, while maintaining relatively low charge carrier beam currents (to prevent space charge), the localized area away from which the charge carrier beam propagates in the I region is advantageously a localized semiconductor zone of a conductivity type (N or P) in which the charge carriers in the charge carrier beam are minority carriers. This localized zone is advantageously characterized by an electrical conductivity which is at least an order of magnitude higher than that of the I region between the localized areas. This localized zone, in which the charge carriers of the beam are minority carriers, provides an electrical rectifying barrier with respect to the I region against the injection of an unduly large number of charge carriers into this I region at those portions removed from the instantaneous confines of the charge carrier beam. Thereby, the charge carrier beam itself can be formed and propagated with a confined cross section and with a controllably low current density throughout the trajectory in the I region between the localized areas.

In addition, the localized zone from which the charge carrier beam propagates and which produces the rectifying barrier described above advantageously provides a substantially equipotential surface at its interface with the I region. As an alternative to an N-type localized zone, a layer of metal or metal-like material, such as platinum silicide on silicon, which forms a Schottky barrier with the I region, can be used for these purposes of providing the equipotential surface and the rectifying barrier with the I region.

In a specific embodiment of the invention, a monocrystalline silicon semiconductor body with a $P^+NIP$ conductivity type structure (formed by impurity diffusion or ion implantation into a single major surface of the body) is utilized as the solid state body in which deflection of a charge carrier beam, specifically a beam of holes takes place. By the symbol $P^+$ or $N^+$ is meant strongly (highly conductive) P-type or N-type semiconductor, respectively; by the symbol I is meant relatively high resistivity semiconductor material (but which can be very weakly P- or N-type), and by the symbol P is meant moderately conductive P-type semiconductor. It should be understood that in general the symbol $N^+$ (or $P^+$) denotes a semiconductor zone having at least an order of magnitude higher conductivity than a zone denoted by the symbol N (or P), and that the symbol N (or P) denotes a semiconductor zone which is at least an order of magnitude higher conductivity than a zone denoted by the symbol I. Advantageously, the $P^+$ zone is formed contiguous to the major surface within the N zone, and this $P^+$ zone itself has a relatively small cross-section area (typically by at least an order of magnitude) as compared with that of the N zone in which this $P^+$ zone is situated; whereas the N zone serves as the localized zone described above from which the charge carrier beam propagates in the I region and with respect to which the charge carriers (holes in this instance) in the beam are minority carriers. The $P^+$ zone serves as a source of charge carriers for the beam of holes, by injection into the localized zone for propagation through the I region. The holes in the beam are introduced in the I region by reason of the phenomenon of injection. Specifically, holes are injected through the N zone in response to an applied forward voltage bias to the $P^+$ zone relative to the N zone contiguous therewith. This N zone itself is advantageously sufficiently thin (less than a diffusion length of the injected minority carriers), so that the injected holes which pass through this N zone enter the I region with essentially the same confined cross section as the cross-section area of the injecting $P^+$ zone itself. The P zone, into which the charge carriers flow after propagation through the I region, is situated contiguous with respect to the same major surface of the semiconductor body as the N zone. Advantageously, this P zone is in the form of a plurality of islands, to each of which is attached a detector load resistor. These islands advantageously form a two-dimensional array, and they serve as localized zones for detection of the position of the charge carrier beam after propagating through the I region.

A suitable applied reverse voltage bias with respect to the NIP portion of the structure produces an electric field, in the I region between the localized N zone and the island P zones, which propels the holes in the charge carrier beam through the I region from the N zone to the island P zones, while maintaining the relatively confined cross-section area of this beam of holes at a relatively constant value throughout the propagation in the I region. These holes in the beam propagate along the resultant lines of electric force field in the I region, and the holes arrive at the island P zones as a beam with essentially the same cross section as that of the $P^+$ injecting zone itself, provided the electric field in the I region is suitably selected. Thereby, a point to point mapping of corresponding points in the N and P zones is provided by the charge carrier beam as it follows the electric field stream lines.

Transverse deflection of the beam of holes streaming from the localized N zone to the localized P zones through the I region is accomplished by means of auxiliary transverse signal electric fields applied therein, that is, perpendicular to the direction of propagation of the charge carrier beam in the absence of deflection. These transverse electric fields are produced in the I region by means of auxiliary deflection voltage sources connected to electrodes located on the major surface of the semiconductor body between the localized N and P zones. Detection of the position of incidence of the beam of holes at the localized island P zones is accomplished by means of an array of detector contact electrodes connected to the corresponding array in two dimensions of island P zones located in the otherwise continuous localized P zone. Each of these electrodes is connected electrically to a voltage detector for sensing the voltage produced by the incidence of the charge carrier beam at a particular (island) position at the localized P zone. Advantageously, the diameter of the cross section of each such island P zone is of the order of the diameter of the cross section of the charge carrier beam.

In general, by means of the confined beams of charge carriers in this invention, an analogue representation of input signals, either electric or magnetic fields applied to the I region between the localized zones, can be obtained at the detecting localized zone in the form of the information as to the position of impact of the beam as a function of time at this localized detecting zone. Moreover, in an alternative embodiment, this invention can be used in a solid state camera tube arrangement in which a geometrical pattern of optical input radiation (the picture) can be converted into an electrical output signal whose variation with time is an analogue representation of the geometrical optical pattern of the picture. This is achieved by the injection into the I region of confined beams of charge carriers excited by the optical input ("photoexcitation"), and subsequent deflection of the charge carrier beams in accordance with a planar analogue of conventional horizontal and vertical scanning deflection signal. The sequential detection of the charge carrier beams at the detecting portions of the localized zone, to which the charge carriers propagate, provides a time-varying output signal corresponding to the optical image

BRIEF DESCRIPTION OF THE DRAWING

This invention together with its objects, features and advantages can be better understood from the following detailed description when read in conjunction with the drawing (not to scale for the sake of clarity only) in which.

For the sake of clarity only, the drawings are not to scale.

DETAILED DESCRIPTION

Figure 1:
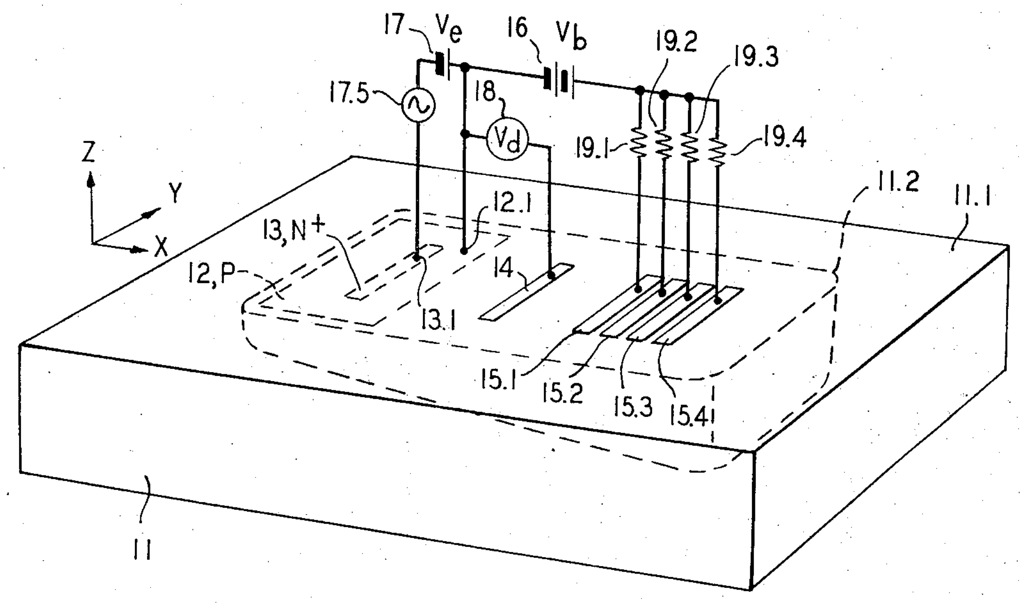
FIG. 1 is a perspective view a planar solid state semiconductor charge carrier beam deflection apparatus, according to a specific embodiment of the invention.

FIG. 1 shows an illustration of a planar geometry type of semiconductor solid state electron beam deflection apparatus, having one-dimensional (*x* direction) deflection capability. A silicon semiconductor wafer 11 is preferably a single crystal of semi-intrinsic electrical conductivity, due to a low uniform net significant impurity concentration of the order of $10^{13}$ per $cm^3$ or less (except for zones 12 and 13 to be described below). That is, the bulk of the wafer 11 is substantially intrinsic semiconductor material. On the top planar surface 11.1 of the wafer 11 is located a localized zone 12 of P-type conductivity. A zone 13 of $N^+$-type conductivity is located within this P zone 12 contiguous to the top surface 11.1. A metal electrode contact 14 is located on the surface 11.1 between the P zone 12 and an array of metal electrode Schottky barrier contacts 15.1 through 15.4. Advantageously, the electrode 14 extends in the *y* direction at least as far as $N^+$ zone 13. Reverse bias voltage is applied between the P zone 12 and the array of electrodes 15.1–15.4 by means of a D.C. voltage source 16 connected to an electrode contact 12.1 to the P zone 12; while a variable forward voltage bias, typically in the range of about zero to two volts, from a D.C. battery 17 and a signal source 17.5, is applied between zones 12 and 13 through the contact 12.1 and an electrode 13.1 contacting the $N^+$ zone 13.

The reverse bias voltage supplied by the battery 16 is at least sufficient to deplete a region 11.2 of substantially all of the mobile charges due to impurities in the wafer 11. The region 11.2 is situated contiguous to the surface 11.1, and extends in the wafer 11 at least from underneath the $N^+$ zone 13 to the farthest electrode 15.4. A voltage source 18 supplies a variable deflection voltage potential between the metal electrode 14 and the P zone 12. The instantaneous voltage supplied by the source 18 determined which one of a group of load detector resistors 19.1–19.4, typically about 10 k ohm to 1000 k ohm each, instantaneously has the greatest voltage drop thereacross. Thereby, the instantaneous pattern of voltage drops across load resistors 19.1–19.4 provides a multi-addressing capability of the signal 17.5 switched by the voltage source 18 into these load resistors.

Advantageously, the silicon wafer 11, except for the zones 12 and 13, has an intrinsic or semi-intrinsic conductivity, which is the result of a net significant donor impurity concentration of the order of $10^{13}$ per $cm^3$ or less. On the other hand, the $N^+$ zone 13 contains a net significant donor impurity concentration typically of the order of $10^{16}$ to $10^{17}$ per $cm^3$ or more, although impurity concentrations below this level can also be used. The P zone 12 contains a net significant acceptor impurity concentration typically of the order of $10^{16}$ to $10^{17}$ per $cm^3$ or more, although concentrations below this level likewise can be used. In any event, the net impurity concentration of the P zone 12 is advantageously at least an order of magnitude below that of the $N^+$ zone 13. The metal or metal-like electrodes 14 and 15.1–15.5 are typically made of platinum-silicide, although other metals or metal-like materials can be used such as aluminum, chromium, or gold; all of which advantageously form a Schottky barrier contact with the silicon wafer 11. The electrode contacts 12.1 and 13.1 are typically platinum silicide, chrome-gold, or aluminum.

The localized P zone 12 is relatively thin, of the order of 1 micron in the *z* direction, whereas the thickness of the wafer 11 in this direction is typically of the order of 50 micron or more. The injecting $N^+$ zone 13 forms a P-N junction at its boundary with the P zone 12, and this $N^+$ zone 13 acts as a source of electrons for the charge carrier beam propagating toward the electrodes 15.1–15.4. This injecting zone 13 is typically only about 0.2 micron thick in the *z* direction.

Typical approximate values for the rectangular cross sections (in the *x* and *y* directions respectively) of the various elements are as follows:

P zone 12: 60 × 50 micron
$N^+$ zone 13: 5 × 40 micron
Electrode 14: 20 × 50 micron
Electrodes 15.1–15.4: 10 × 50 micron.

In any event, the cross section of the $N^+$ zone 13 is advantageously significantly less than that of the P zone 12, typically by at least an order of magnitude; since the number of resolvable points which can be mapped is limited to the ratio of the cross section of the P zone 12 to the cross section of the $N^+$ zone 13.

The lengths in the *y* direction of the electrodes 14 and 15.1–15.4 are advantageous in all events approximately the same as, or slightly larger than, the length of the $N^+$ zone 13 in this *y* direction. Moreover, the aspect ratio of the width in the *x* direction of the $N^+$ zone 13 to the width of the P zone 12 is approximately the same as (or slightly less, in order to compensate for charge carrier beam spreading) the aspect ratio of the width of each of the detector electrodes 15.1–15.4 to the distance in the *x* direction between outermost extremities of the electrodes 15.1 and 15.4.

The distance in the *x* direction between centers of the zone 13 and the electrode 14 is typically 50 to 75 micron; the distance in the *x* direction between the centers of the zone 13 and the nearest electrode 15.1 is in the range of 75 to 125 micron, typically about 100 micron; and the spacing between neighboring electrodes in the array 15.1–15.4 is typically 5 micron. The deflection voltage 18 typically varies between about 40 and 300 volts peak to peak. The reverse bias voltage supplied by the battery 16 is in the range of about 30 to 200 volts, typically 75 volts, so that the average electric field produced in the wafer 11 between the P zone 12 and the electrode 15.1 is in the range of about $0.3 \times 10^4$ to $2 \times 10^4$ volt/cm.

Figure 2:
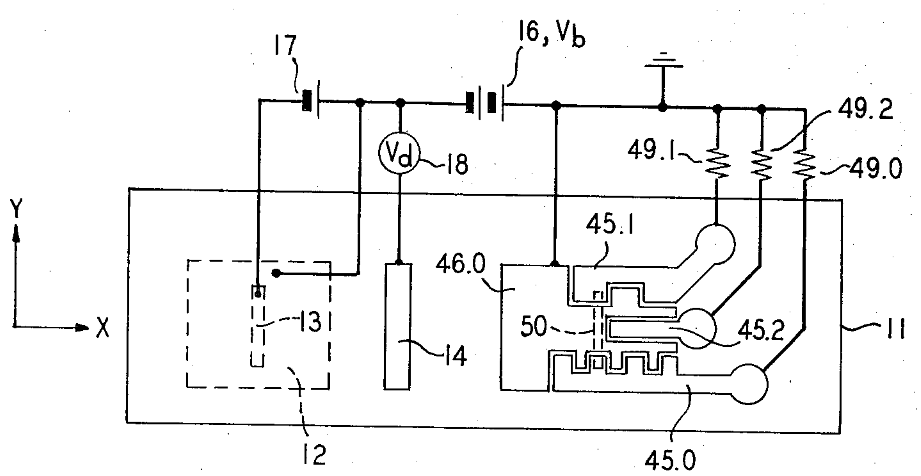
FIG. 2 is a top view of a planar solid state semiconductor charge carrier beam deflection apparatus with binary coded output detection, according to another specific embodiment of the invention.

FIG. 2 shows a top view of a semiconductor solid state charge carrier beam deflection apparatus, similar to that shown in FIG. 1, but with an encoded analogue to digital capability. Elements of the apparatus shown in FIG. 2, which are identical to those shown in FIG. 1, are labeled with the same reference numerals. Except for the arrangement of an array of detector electrodes 45.0–45.2, instead of the previously described electrodes 15.1–15.4 (and the resistors 49.0–49.2 instead of 19.1–19.4), the apparatus shown in FIG. 2 is substantially identical to that shown in FIG. 1. The electrode 45.0 represents the coded binary digit corresponding to $2^0$; the electrode 45.1 corresponds to the coded binary digit $2^1$; and the electrode 45.2 corresponds to the digit $2^2$. The presence or absence of the charge carrier beam at these electrodes is detected by the load resistors 49.0–49.2. This electrode arrangement is selected in accordance with known coding techniques, such as described for example in the *Bell Laboratories Record*, Vol. 48, at page 271 (September 1964). Electrode 46.0, substantially complementary to electrodes 45.0–45.2, serves as a sink for charge carriers in the beam which should not impinge upon any of the electrodes 45.0–45.2. The instantaneous cross section 50 of the charge carrier beam, impinging upon the surface of the semiconductor 11 in the neighborhood of the electrodes 45.0–45.2, is in the shape of an elongated rectangle of substantially the same size as the elongated rectangle zone 13. The arithmetic number represented by the particular instantaneous location of this cross section 50 shown in FIG. 2 corresponds to the binary number (011), that is, the analogue decimal numeral equal to 3.

It is important for the proper representation of the binary encoding of the signal voltage 18 applied to the electrode 14, that the electrodes 45.0 and 45.1 are located such that the cross section 50 of the impinging beam nowhere extends in the y direction so far that it reaches the connecting portions of these electrodes 45.0 and 45.1 at the extremities thereof, these connecting portions running along the x direction for electrical connection of these electrodes to the load resistors 49.0 and 49.1, respectively. On the other hand, the location of the cross section 50 of impingement of the beam in the x direction is determined by the instantaneous voltage level supplied by the deflection voltage source 18, as should be understood from a reading of the above description of the apparatus shown in FIG. 1.

It should also be understood that the geometric arrangements of the detector electrodes 45.0–45.2 can be modified in accordance with well-known encoding principles such as are described in the aforementioned *Bell Laboratories Record*, Vol. 48, page 267, at 271 (September 1964) and in *Bell System Technical Journal*, Vol. 44, page 1887, at 1890 (November 1965).

Figure 3:
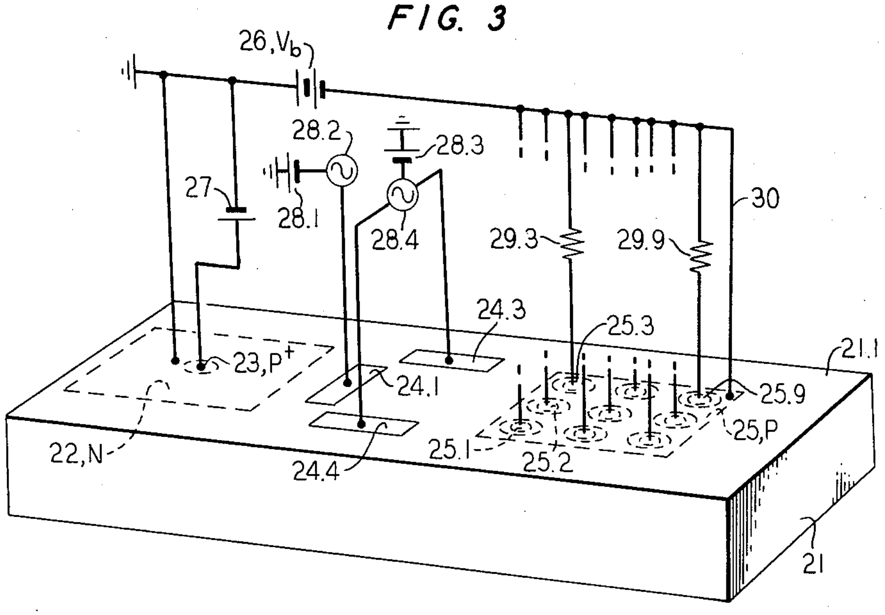
FIG. 3 is a perspective view of a planar semiconductor solid state charge carrier beam apparatus with two-dimensional deflection capability, according to another specific embodiment of the invention.

The apparatus as shown in FIGS. 1 and 2 are suitable for controlled deflection in the x direction only. In order to afford two-dimensional deflection capability, apparatus of the type shown in FIG. 3 is suitable. In addition, for the sake of emphasis of the capability in this invention of using charge carrier beams of holes (instead of electrons previously described in detail in connection with the apparatus shown in FIG. 1), the apparatus shown in FIG. 3 interchanges P- and N-type semiconductor material relative to the apparatus shown in FIG. 1. In the apparatus shown in FIG. 3, a circularly shaped $P^+$ injecting zone 23, typically of about 0.2 micron thickness (in the z direction), is embedded in a localized N zone 22, typically of about 1 micron thickness. This localized zone 22 is situated contiguous with the top surface 21.1 of a substantially intrinsic semiconductor body 21 similar to the wafer 11 previously described. Detection of the beam of holes injected by the $P^+$ zone 23 is accomplished by means of detection load resistors 29.1–29.9. Each of these load resistors is connected through separate electrode contacts to an array of island-shaped P-type zones 25.1–25.9 situated in a P-type zone 25. This P zone 25 is ohmically connected by lead 30 to a D.C. bias source 26. The P-type zone 25, together with the zones 25.1–25.9, are all advantageously formed by well-known methods of geometrically controlled diffusion of impurities. The aspect ratio of the diameter of $P^+$ zone 23 to the width of the N zone 22 in the x direction, and of each diameter of each island zone 25.1–25.9 to the width of P zone 25 in the x direction, are advantageously all approximately the same, similarly as for the corresponding aspect ratio in FIG. 1.

Deflection in the x and y directions of the beam of holes arriving at the P zone 25, after propagation from the localized N zone 22 subsequent to injection by the $P^+$ zone 23, is accomplished respectively by means of signal voltages 28.2 and 28.4 applied to electrodes 24.1 and 24.3–24.4, respectively. Advantageously, the interfaces both of the N zone 22 and of the P zone 25 with the remainder of the wafer 21, are substantially planar, in order to furnish equipotential plane surfaces thereat respectively. Also, the injecting $P^+$ zone 23 has a diameter advantageously of the order of 5 micron or less, so that the beam of holes, as it reaches the P zone 25, also still has a relatively confined cross section of approximately the same diameter. Thus, the diameter of each of the island-shaped zones 25.1–25.9 is likewise of the order of 5 micron. It is important that the polarity of the battery 26 be arranged to furnish a reverse bias between the N zone 22 and the P zone 25. Typically, this P zone 25 has a net significant impurity concentration in the range of about $10^{16}$ to $10^{18}$ per $cm^3$ or more; but in any event, the electrical conductivity of the P zone 25 should be made higher than the conductivity of the bulk of the wafer 21 having intrinsic or semi-intrinsic conductivity. Thus, the interface of the P zone 25 with the rest of the wafer 21 forms a substantially equipotential surface. The lead wire 30 contacting the P zone 25 serves as a sink for charge carriers which instantaneously do not impinge upon any of the islands 25.1–25.9.

The electrode 24.1 has a length in the y direction advantageously at least as long as the length of the localized N zone 22 in this direction (also equal advantageously to that of the P zone 25), that is, about 50 micron; and this electrode 24.1 is typically 20 micron wide in the x direction. The distance between nearest approaches of the localized N zone 22 and the localized P zone 25 is advantageously in the range of about 50 to 500 microns, typically about 100 microns; whereas the reverse bias voltage supplied by the battery 26 is in the range of about 40 to 400 volts, typically about 100 volts.

The electrode 24.1 controls the deflection in the x direction of the beam of holes as it impinges upon the various islands 25.1–25.9. This electrode 24.1 can advantageously be located between the N zone 22 and the pair of electrodes 24.3 and 24.4, or alternatively between the P zone 25 and this pair of electrodes.

The electrodes 24.3 and 24.4 typically have lengths of about 50 micron in the x direction, and these electrodes are spaced apart in the y direction by a distance approximately equal to the length of the localized N zone 22 in this direction. The deflection voltages, supplied by the voltage sources 28.2 and 28.4, both vary in the range of about 60 to 600 volts (as measured peak to peak); and these deflection voltages are D.C. biased by means of batteries 28.1 and 28.3, typically of about 30 to 300 volts each. Load resistors 29.1–29.9 detect which of the islands 25.1–25.9 is impinged by the beam of charge carriers (holes) on arrival at the P zone 25, thereby providing a multiaddressable array of detection elements.

As mentioned above, the reverse bias voltage, supplied by the battery 26 across the pair of localized zones 22 and 25 (from which and to which the charge carrier beam propagates), should be selected sufficiently high so that in the optimal case the lateral diffusion of charge carriers during the transit (between the localized zones) is at a minimum. However, too high a bias voltage can produce too high a longitudinal electric field which tends to increase the lateral beam spread (cross section), because of an increased diffusion coefficient without a compensating decrease in the transit time (due to velocity saturation). By the longitudinal electric field is meant the electric field in the average direction of propagation in the I region of the charge carrier beam from one localized area to the other. On the other hand, too low a longitudinal electric field in the I region tends to increase the lateral beam spread, because of an increased transit time without a compensating decrease in the diffusion coefficient. Therefore, advantageously, the longitudinal electric field produced by the bias voltage is selected in the optimal case to make the average quotient of diffusion constant and velocity a minimum, averaged in space over the path of the charge carrier beam in the I region between the localized zones 22 and 25. In any event, it is important in this invention that the longitudinal electric field should be sufficient to deplete the I region in the semiconductor body 21, between the localized zones 22 and 25, of substantially all the mobile charge carriers therein due to impurities. Thereby, background bulk conduction current is eliminated by reason of the depletion of mobile charges by the electric field.

As a consequence of all the above considerations, typically a bias voltage of approximately 100 volts across the localized area spaced apart at least approximately 100 micron in a silicon crystal semiconductor body is used for the purpose of providing suitable voltage bias, in order to produce the desired electric field in the semiconductor I region wherein the charge carrier beam propagates. Bias voltages in the range of about 30 to 500 volts are also feasible in silicon, corresponding to average electric fields of between about $0.3 \times 10^4$ and $5 \times 10^4$ volt/cm. Such bias voltage will produce an electric field in the I region of the semiconductor between the localized areas such that, at all points of the charge carrier beam therein, the charge carriers in the beam substantially follow the direction of the electric field in the body from point to point. Thus, the direction of propagation of the charge carrier beam is everywhere substantially parallel to the local electric field direction in the I region between the localized zones 22 and 25.

Preferably, the I region between the localized zones 22 and 25, through which the charge carrier beam propagates, is not compensated material; that is, the relatively high resistivity of the I region of the semiconductor body 21 through which the charge carrier beam propagates is attributable to the relatively high purity of the semiconductor, rather than an equal ("compensated") number of significant donor and acceptor impurities in the semiconductor; thereby, lateral diffusion of the charge carrier beam is minimized.

In order to maintain the longitudinal electric field within the desired range in the I region between the localized zones 22 and 25, the impurity concentration in this I region (where the charge carrier beam of holes propagates between the localized N zone 22 and localized P zone 25 or island P zones 25.1–25.9) should be made sufficiently low, in order to maintain uniformity of the electric field and thereby prevent the electric field from excursions outside the desired range, as is predictable by Poisson's equation. Advantageously, the interface or junction of the I region with the N zone 22, through which the beam of holes is injected, is a substantially planar surface (except for the edges thereof). Moreover, the localized island P zones 25.1–25.9 are advantageously all surrounded by the localized P zone 25 such that a substantially planar surface (except for the edges) is formed by the interface of all these localized P zones with the I region. Thereby, both of these substantially planar interfaces provide a pair of substantially planar equipotential surfaces between which the charge carrier beam propagates along the electric field stream lines produced by the bias voltage supplied by the battery 26.

Whereas the interface of the N zone 22 with the I region provides a rectifying barrier against the injection of holes into the I region (except directly underneath the $P^+$ zone 23), the interface of the localized P zones 25.1 with the I region provides a rectifying barrier against the injection of electrons into the I region at the interface with these P zones. Thus the background noise, due to injected charge carriers elsewhere than in the cross section of the relatively confined beam of holes, is minimized.

Charge carrier beams having an initial diameter of the order of 5 micron, with no more than an added 5 micron lateral spreading, can be propagated in this invention through an I region of silicon in which the distance between the localized zones is of the order of 100 micron, provided the electric field which propels the beam through the I region is properly selected. Moreover, the current density in the charge carrier beam advantageously should be kept sufficiently low in the presence of the longitudinal electric field produced by the reverse bias voltage, in order to inhibit the formation of a space charge in an amount which would otherwise cause undesired beam spreading. Therefore, advantageously, the current for a beam of charge carriers having a diameter of approximately 5 micron should be kept below 0.5 microampere, typically at approximately 0.1 microampere.

Figure 4:
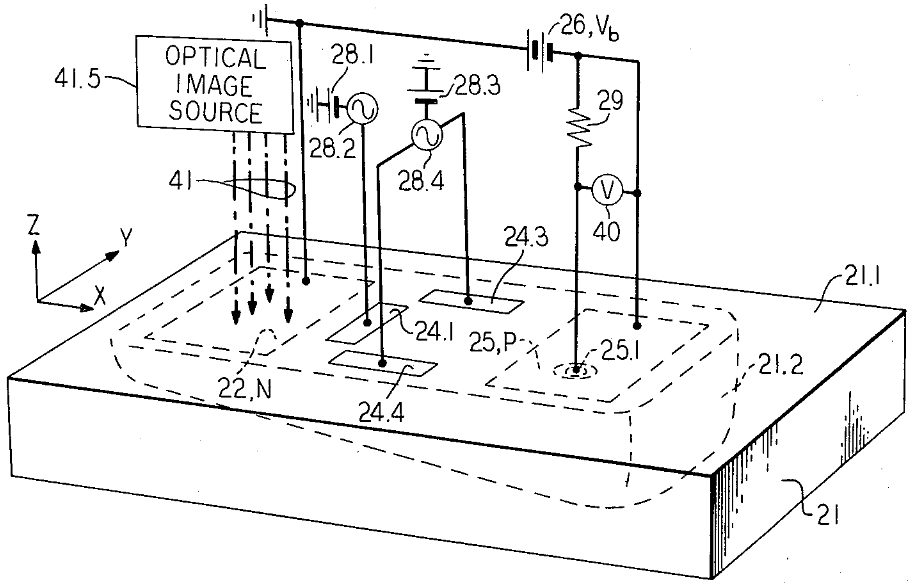
FIG. 4 is a perspective view of a solid state electronic camera apparatus, according to yet another specific embodiment of the invention.

As shown in FIG. 4, in an alternative embodiment, this invention can be used as a completely solid state electrical camera apparatus. Referring to FIG. 4, many of the elements of this embodiment are substantially identical to those previously described in conjunction with the apparatus shown in FIG. 3. These common elements are therefore labeled with the same reference numerals in both of these figures. The major difference between the apparatus shown in FIG. 4, as compared with FIG. 3, involves the means for injecting the charge carrier beam propagating from the N zone 22 to the P zone 25. In the apparatus shown in FIG. 4, a two-dimensional beam pattern of light 41 from an optical image source 41.5 is incident upon the N zone 22, thereby creating a source of the charge carrier beam. This source is characterized by a corresponding two-dimensional pattern of electrons and holes in the depleted region 21.2 contiguous with this N zone 22. The holes are then propagated, by reason of the bias voltage 26, from N zone 22 towards P zone 25, while preserving the two-dimensional pattern (of information) in the light beam 41, that is, the cross section of the resulting confined beam of holes propagating in the depleted region 21.2 of the $\pi$ type (semi-intrinsic) body 21 preserves and corresponds to the information of the relatively dark and bright portions of the two-dimensional pattern in the light beam 41. Therefore, when the beam of holes reaches the P zone 25, this beam is characterized by a nonuniform intensity of electrical current, which varies across its cross section in accordance with the two-dimensional pattern of light 41. A load resistor 29 detects the intensity of that portion of the cross section of the beam of holes arriving at the island portion 25.1 of the P zone 25. Scanning of the two-dimensional cross section of the beam of holes arriving at the P zone 25 is accomplished by means of voltage sources 28.2 and 28.4, in similar fashion as in the apparatus shown in FIG. 3. In accordance with conventional techniques, the voltage source 28.4 produces "horizontal" scanning, whereas the voltage 28.2 produces "vertical" scanning; and these voltage sources may advantageously be mutually synchronized accordingly. Typically, therefore, the voltage source 28.4 supplies a linear ramp ("sawtooth") voltage, whereas the voltage source 28.2 supplies a lower frequency scanning voltage. Thereby, the voltage developed across the load detector 29, as a function of time, represents in analogue form the two-dimensional pattern of light in the optical beam 41. Thus, the apparatus shown in FIG. 4 converts the two-dimensional pattern of light 41 into an analogue time-varying output electrical signal across the load 29, that is to say, this arrangement provides a solid state electrical camera apparatus. Utilization means 40, such as a voltage detector, serves to detect and process the signal developed across the load 29.

It will be recognized by those skilled in the art, that passivation of the top surface of the bodies shown in FIGS. 1-4 is useful for preventing surface leakage channels by reason of surface inversion layers. Such passivation, as known in the art, can take the form of appropriate oxide coatings and/or tailoring the impurity concentration profiles of the zone 12 and 22 in FIGS. 1–4.

It should be understood that it is important that the doping and thickness of the above-described zones 12 and 22 should in all events be sufficiently large such that these zones are not themselves depleted of mobile charge carriers due to impurities. Also, at least semitransparent metal electrodes which form Schottky barriers with the semiconductor body 21 can be used in place of the localized N type zone 22 in the apparatus shown in FIG. 4.

It should be understood by those skilled in the art, that although the above-detailed description of specific embodiments has been in terms of silicon as a semiconductor, other semiconductors can also be used in the practice of this invention such as germanium, gallium arsenide, or other Group IV, Group III–V, and Group II–VI semiconductors. Also, instead of deflecting the charge carrier beam with applied electric fields, applied magnetic fields can also be used to provide horizontal and vertical control of the charge carrier beam. Moreover, although the localized zones 12, 22, 25 and electrodes 15.1–15.4 have been illustrated as rectangularly shaped, any arbitrary shape can be used for the cross section of these elements.

While this invention has been described in terms of specific embodiments, various modifications may be made by the worker of ordinary skill in the art without departing from the scope of this invention.

What is claimed is:

1. A solid state charge carrier beam deflection apparatus which comprises:
   a. a body whose bulk is of a high resistivity semiconductor and which has a major planar surface;
   b. injecting means for producing a charge carrier beam for propagating inside the body, said beam having a predetermined cross-sectional pattern significantly smaller than the area of the surface, said injecting means located on the major planar surface;
   c. detecting means for sensing the position of the beam arriving at a location on the major surface, said location being removed from the injecting means;
   d. means for producing in the body an electric field sufficient to deplete substantially all the mobile charge carriers due to impurities in the body in a region between the injecting and detecting means, and to propel charge carriers in the beam through the body to the detecting means, such that the cross section of the beam at the detecting means is substantially the same as at the injecting means, said electric field being produced by means of voltages applied across electrical contacts to the said major surface; and
   e. deflecting means for varying the position of impact of the beam arriving at the detecting means.

2. The apparatus recited in claim 1 in which the body of intrinsic or semi-intrinsic semiconductor is silicon having a resistivity of the order of 10kΩ-cm, and the longitudinal electric field is in the range between about 3 and 50 kilovolts per cm.

3. Apparatus according to claim 2 in which the distance between the injecting means and the detecting means is of the order of 100 micron.

4. Apparatus according to claim 1 in which the detecting means includes:
   an array of a plurality of detector electrodes disposed in physical contact with the body on the major planar surface thereof.

5. Apparatus according to claim 4 in which the detecting means has a cross-section pattern in accordance with a predetermined encoding pattern.

6. Apparatus according to claim 1 in which the deflecting means is adapted to vary the position of impact of the beam arriving at the detecting means in a first direction which is parallel to the average direction of propagation of the beam in the body.

7. Apparatus according to claim 6 in which the deflection means includes an electrode to which an electrical deflection signal is applied.

8. Apparatus according to claim 1 in which the deflecting means is adapted to vary the position of impact of the beam arriving at the detecting means in a second direction which is parallel to the surface of the body and is perpendicular to the average direction of propagation of the beam in the body.

9. Apparatus according to claim 8 in which the deflecting means includes a pair of electrodes across which an electrical signal voltage is applied.

10. Apparatus according to claim 1 in which the deflecting means can vary the position of impact of the beam arriving at the detecting means in two independent directions.

11. Apparatus according to claim 1 in which the deflecting means in the first direction includes an electrode disposed on the major surface between injecting means and the detecting means, a voltage signal source being electrically connected to said electrode means.

12. Apparatus according to claim 4 in which the detecting means include a localized semiconductor zone of conductivity type such that the charge carriers in the beam are majority carriers in said localized zone, said zone located contiguous with the major surface of the body.

13. Apparatus according to claim 1 in which the means for injecting the charge carrier beam includes a metal layer or doped layer disposed on the major surface forming a Schottky barrier or junction thereat, and further including an optical source which provides a predetermined pattern of light incident upon said layer in order to produce a corresponding pattern in the beam intensity of the cross section of the charge carrier beam.

14. Apparatus according to claim 1 in which the injecting means includes a source of a two-dimensional pattern of optical radiation incident upon the body.

15. Apparatus according to claim 1 in which the injecting means includes first and second localized semiconductor zones of opposite conductivity type, the first zone being located in the body wholly within the second zone in the body, the first zone being contiguous with respect to the major surface, the first zone having a cross section which is at least an order of magnitude less than the cross section of the second zone, and the second zone having a conductivity type such that the charge carriers in the beam are minority carriers in the second zone.

16. Apparatus according to claim 1 in which the detecting means includes an array of a plurality of Schottky barrier metal electrodes disposed on the major surface and to which are individually attached electrically conductive means to an equal plurality of electrical signal detector means.

17. Apparatus according to claim 1 in which the detecting means includes a localized zone containing a plurality of island-shaped zones of the same conductivity type as the localized zone, individual electrical signal detection means being attached to each of the island-shaped zones, the conductivity type of the localized zone being such that charge carriers in the beam are majority carriers.

* * * * *